(12) United States Patent
Wu

(10) Patent No.: US 10,649,602 B2
(45) Date of Patent: *May 12, 2020

(54) TOUCH DEVICE

(71) Applicant: Innolux Corporation, Miao-Li County (TW)

(72) Inventor: Cheng-Min Wu, Miao-Li County (TW)

(73) Assignee: Innolux Corporation, Miao-Li County (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/248,781

(22) Filed: Jan. 16, 2019

(65) Prior Publication Data

US 2019/0146614 A1    May 16, 2019

Related U.S. Application Data

(62) Division of application No. 15/299,487, filed on Oct. 21, 2016, now Pat. No. 10,222,914.

(Continued)

(30) Foreign Application Priority Data

Apr. 6, 2016 (TW) .............................. 105110692 A

(51) Int. Cl.
*G06F 3/044* (2006.01)
*G06F 3/041* (2006.01)
(Continued)

(52) U.S. Cl.
CPC .......... *G06F 3/044* (2013.01); *G02F 1/13338* (2013.01); *G02F 1/13454* (2013.01); *G02F 1/136204* (2013.01); *G06F 3/0412* (2013.01); *H01L 27/0292* (2013.01); *H01L 27/124* (2013.01); *H01L 29/78633* (2013.01); *G02F 2201/121* (2013.01); *G06F 2203/04103* (2013.01); *G06F 2203/04107* (2013.01); *H01L 27/1214* (2013.01); *H01L 27/323* (2013.01);
(Continued)

(58) Field of Classification Search
CPC ................... G06F 3/0412; G06F 3/044; G06F 2203/04103; G06F 2203/04107
See application file for complete search history.

(56) References Cited

U.S. PATENT DOCUMENTS

| 6,961,049 B2 * | 11/2005 | Mulligan | ................ G06F 3/044 |
| | | | 178/18.06 |
| 2012/0105081 A1 * | 5/2012 | Shaikh | ................ G06K 9/0002 |
| | | | 324/686 |

(Continued)

*Primary Examiner* — Koosha Sharifi-Tafreshi
(74) *Attorney, Agent, or Firm* — JCIPRNET

(57) ABSTRACT

A touch device including an array substrate, at least one gate driving circuit, an opposite substrate and a shielding pattern is provided. The array substrate has a display region and a peripheral region connecting to the display region. The gate driving circuit is disposed on the array substrate and located in the peripheral region. The opposite substrate is disposed opposite to the array substrate. The shielding pattern is disposed between the array substrate and the opposite substrate. The shielding pattern projected on the array substrate is formed a first projection, the gate driving circuit projected on the array substrate is formed a second projection, the first projection at least partially overlaps with the second projection.

19 Claims, 5 Drawing Sheets

Related U.S. Application Data

(60) Provisional application No. 62/245,299, filed on Oct. 23, 2015.

(51) Int. Cl.
    *H01L 27/02*     (2006.01)
    *G02F 1/1362*     (2006.01)
    *G02F 1/1333*     (2006.01)
    *G02F 1/1345*     (2006.01)
    *H01L 29/786*     (2006.01)
    *H01L 27/12*     (2006.01)
    *H01L 27/32*     (2006.01)

(52) U.S. Cl.
    CPC ...... *H01L 27/3262* (2013.01); *H01L 27/3272* (2013.01)

(56) References Cited

U.S. PATENT DOCUMENTS

| | | | |
|---|---|---|---|
| 2012/0127124 A1* | 5/2012 | Zanone | G06F 1/3231 345/174 |
| 2014/0049721 A1* | 2/2014 | Huang | G02F 1/136204 349/59 |
| 2014/0176464 A1* | 6/2014 | Kim | G06F 3/044 345/173 |
| 2016/0063916 A1* | 3/2016 | Ota | G09G 3/3233 345/206 |
| 2017/0307944 A1* | 10/2017 | Xing | G02F 1/1309 |

\* cited by examiner

TOUCH DEVICE

CROSS-REFERENCE TO RELATED APPLICATION

This application is a divisional application of and claims the priority benefit of U.S. application Ser. No. 15/299,487, filed on Oct. 21, 2016, now allowed, which claims the priority benefits of U.S. provisional application Ser. No. 62/245,299, filed on Oct. 23, 2015 and Taiwan application serial no. 105110692, filed on Apr. 6, 2016. The entirety of each of the above-mentioned patent applications is hereby incorporated by reference herein and made a part of this specification.

BACKGROUND

1. Field of the Invention

The disclosure relates to a touch device.

2. Description of Related Art

In panel design, a technique that directly fabricates a gate driving circuit on an array substrate to replace an external driving chip is known as Gate drive on Array (GOA) technique. In the display devices of In-Plane Switching (IPS) type or Fringe Field Switching (FFS), the gate driving circuit is usually disposed in a peripheral region of the array substrate without any shielding elements disposed thereon. Therefore, the gate driving circuit is prone to damage caused by Electrostatic Discharge (ESD).

In order to solve such problem, a transparent conductive layer is formed on an outer surface of a color filter substrate that is far away from the array substrate in conventional art, so as to completely cover a display region and the peripheral region where the gate driving circuit is located. Indeed, aforesaid method may be used to prevent the gate driving circuit from damage caused by ESD. However, in today's increasing demands for multifunction on electronic products, the display device usually includes a touch function (e.g., an in-cell touch display device). Because the in-cell touch display device has a touch electrode of in-cell type, it is impossible to dispose the comprehensive transparent conductive layer for shielding ESD on the outer surface of the color filter substrate since electronic properties of elements and the touch function of the touch electrode may be affected by doing so. Accordingly, it has become an important issue to be addressed as how to effectively improving the gate driving circuit of the touch display device from damage caused by ESD.

SUMMARY

The disclosure is directed to a touch device, which is capable of effectively improving the gate driving circuit from damage caused by ESD.

The touch device of the disclosure includes an array substrate, at least one gate driving circuit, an opposite substrate and a shielding pattern. The array substrate has a display region and a peripheral region, and the peripheral region connects to the display region. The gate driving circuit is disposed on the array substrate and located in the peripheral region. The opposite substrate is disposed opposite to the array substrate. The shielding pattern is disposed between the array substrate and the opposite substrate. The shielding pattern projected on the array substrate is formed a first projection, the gate driving circuit projected on the array substrate is formed a second projection, the first projection at least partially overlaps with the second projection.

In an embodiment of the disclosure, the array substrate includes a base plate, a plurality of active devices, a plurality of pixel electrodes, a common electrode and a ground ring. The active devices are arranged in array on the base plate and disposed in the display region. The pixel electrodes are disposed on the base plate and located in the display region, wherein the pixel electrodes are electrically connected to the active devices respectively. The common electrode is disposed between the base plate and the pixel electrodes or between the opposite substrate and the pixel electrodes and is located in the display region. The ground ring is disposed on the base plate and located in the peripheral region, wherein the gate driving circuit is located between the ground ring and the display region.

In an embodiment of the disclosure, the shielding pattern is structurally and electrically connected to the common electrode, the shielding pattern and the common electrode or the pixel electrodes include the same material.

In an embodiment of the disclosure, the shielding pattern and the common electrode or the pixel electrodes are the same layer.

In an embodiment of the disclosure, the shielding pattern is electrically connected to the ground ring, the shielding pattern and the pixel electrodes or the common electrode include the same material.

In an embodiment of the disclosure, the shielding pattern and the common electrode or the pixel electrodes are the same layer.

In an embodiment of the disclosure, the shielding pattern is electrically floating and the shielding pattern and the pixel electrodes or the common electrode includes the same material.

In an embodiment of the disclosure, the shielding pattern and the common electrode or the pixel electrodes are the same layer.

In an embodiment of the disclosure, the shielding pattern is disposed on the opposite substrate, and is electrically connected to the ground ring through a conductive structure.

In an embodiment of the disclosure, the touch device further includes at least one touch driving unit and at least one touch sensing unit. One of the touch driving unit and the touch sensing unit is located on the opposite substrate, and the other one of the touch driving unit and the touch sensing unit is located on the array substrate.

In an embodiment of the disclosure, the first projection completely covers the second projection.

In an embodiment of the disclosure, the shielding pattern is disposed on the opposite substrate, and the shielding pattern is electrically floating.

In an embodiment of the disclosure, the touch device is a self-capacitance touch device.

In an embodiment of the disclosure, the shielding pattern is completely in the peripheral region.

In an embodiment of the disclosure, the display medium is disposed between the array substrate and the opposite substrate.

In an embodiment of the disclosure, the touch device is an in-cell touch device.

Based on the above, it can be known that the touch device of the disclosure has the shielding pattern, wherein the shielding pattern is disposed between the array substrate and the opposite substrate, and the normal projection of the shielding pattern on the array substrate at least partially overlaps with the normal projection of the gate driving circuit on the array substrate. Accordingly, the gate driving circuit may be protected by the shielding pattern, such that may improve the issue of the gate driving circuit damage caused by ESD.

To make the above features and advantages of the disclosure more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1A:
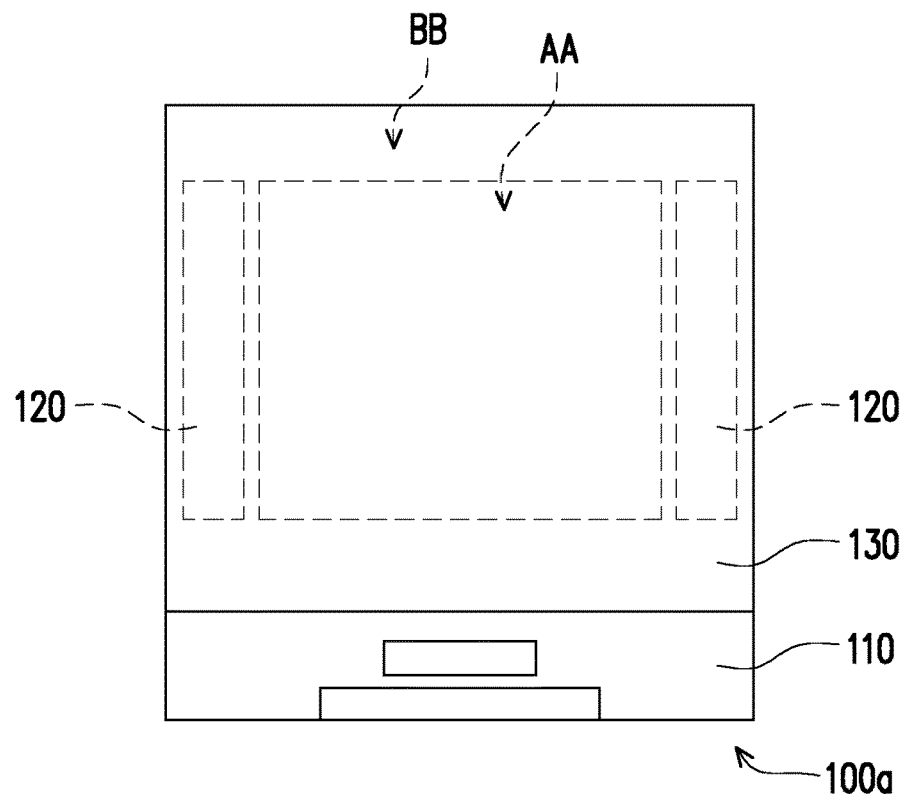
FIG. 1A illustrates a top view of a touch device according to an embodiment of the disclosure.

Reference will now be made in detail to the present embodiments of the disclosure, examples of which are illustrated in the accompanying drawings. Wherever possible, the same reference numbers are used in the drawings and the description to refer to the same or like parts.

Figure 1B:
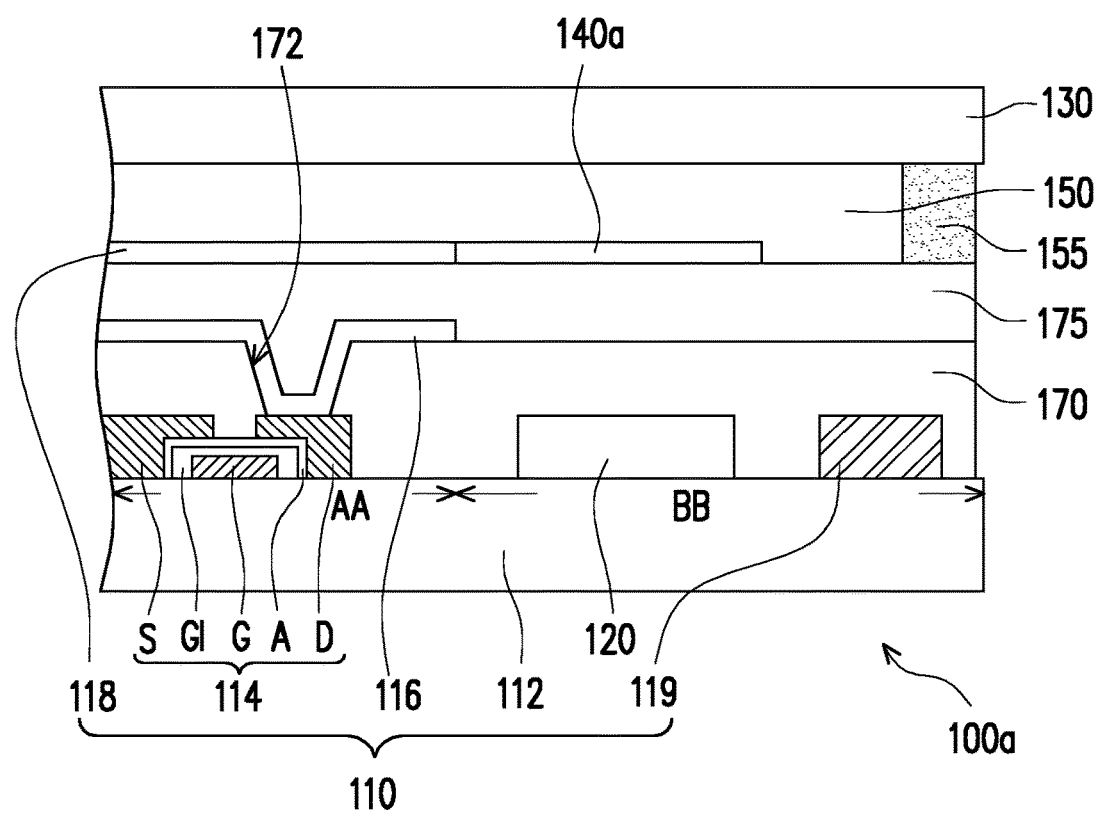
FIG. 1B illustrates a partial cross-sectional view of the touch device of FIG. 1A.

FIG. 1A illustrates a top view of a touch device according to an embodiment of the disclosure. FIG. 1B illustrates a partial cross-sectional view of the touch device of FIG. 1A. For descriptive convenience, illustration of some elements is omitted in FIG. 1A and FIG. 1B. Referring to FIG. 1A and FIG. 1B together, in the present embodiment, a touch device 100a includes an array substrate 110, at least one gate driving circuit 120 (two of which are schematically illustrated in FIG. 1A), an opposite substrate 130 and a shielding pattern 140a. The array substrate 110 includes a display region AA and a peripheral region BB connecting the display region AA. In another embodiment, the peripheral area BB may surround the display region AA. The gate driving circuit 120 is disposed on the array substrate 110 and located in the peripheral region BB. The opposite substrate 130 is disposed opposite to the array substrate 110. The shielding pattern 140a is disposed between the array substrate 110 and the opposite substrate 130. The shielding pattern 140a projected on the array substrate 110 is formed a first projection, the gate driving circuit 120 projected on the array substrate 110 is formed a second projection, and the first projection at least partially overlaps with the second projection. In other words, a normal projection of the shielding pattern 140a on the array substrate 110 at least partially overlaps with a normal projection of the gate driving circuit 120 on the array substrate 110.

Specifically, referring to FIG. 1B, the array substrate 110 of the present embodiment includes a base plate 112, a plurality of active devices 114 (one of which is schematically illustrated in FIG. 1B), a plurality of pixel electrodes 116 (one of which is schematically illustrated in FIG. 1B), a common electrode 118 and a ground ring 119. The active devices 114 are arranged in array on the base plate 112, disposed in the display region AA, and connected to the gate driving circuit 120 and driving by the gate driving circuit 120. Each of the active devices 114 is composed of a gate G, a gate insulation layer GI, an active layer A, a source S and a drain D. In other words, the array substrate 110 may be considered as a thin film transistor array substrate. The pixel electrodes 116 are disposed on the base plate 112 and located in the display region AA, wherein the pixel electrodes 116 are electrically connected to the drains D of the corresponding active devices 114 respectively. More specifically, an insulation layer 170 is disposed on the active device 114, and the pixel electrode 116 is disposed on the insulation layer 170, wherein the pixel electrode 116 is extended into an opening 172 of the insulation layer 170 to be electrically connected to the drain D. The common electrode 118 is disposed between the opposite substrate 130 and the pixel electrodes 116 and located in the display region AA, wherein a normal projection of the common electrode 118 on the base plate 112 at least partially overlaps with a normal projection of the pixel electrodes 116 on the base plate 112. In other embodiments, the common electrode 118 may also be disposed between the base plate 112 and the pixel electrodes 116. That is to say, a location of the common electrode 118 is not particularly limited.

Figure 1C:
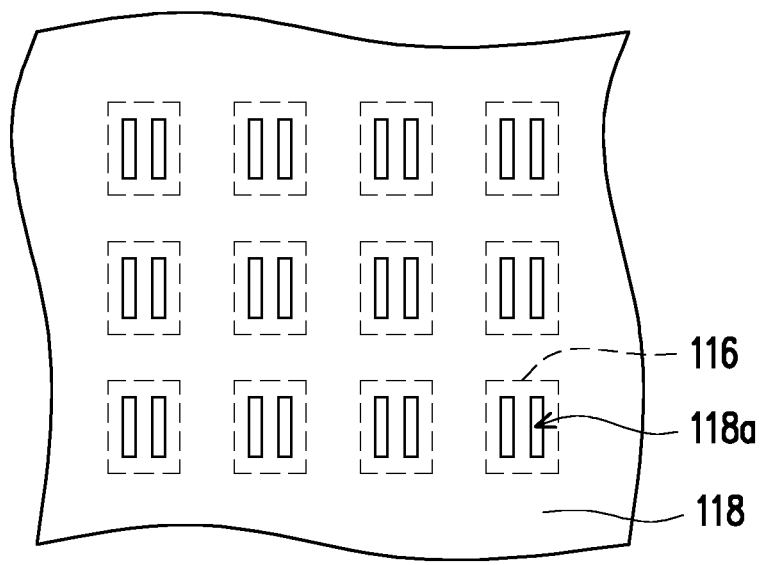
FIG. 1C illustrates a top view of the pixel electrodes and the common electrode of FIG. 1B.

Specifically, referring to FIG. 1B and FIG. 1C together, the common electrode 118 of the present embodiment is disposed above the pixel electrodes 116, and has a plurality of slits 118a. In other embodiments not illustrated, it is also possible that the pixel electrodes 116 are located above the common electrode 118, and at least one of the pixel electrodes 116 and the common electrode 118 includes a plurality of slits or a plurality of branch patterns. Herein, an insulation layer 175 is provided between the common electrode 118 and the pixel electrodes 116 to electrically isolate the common electrode 118 from the pixel electrodes 116. In addition, the ground ring 119 is disposed on the base plate 112 and located in the peripheral region BB, wherein the gate driving circuit 120 is located between the ground ring 119 and the display region AA.

Figure 1D:
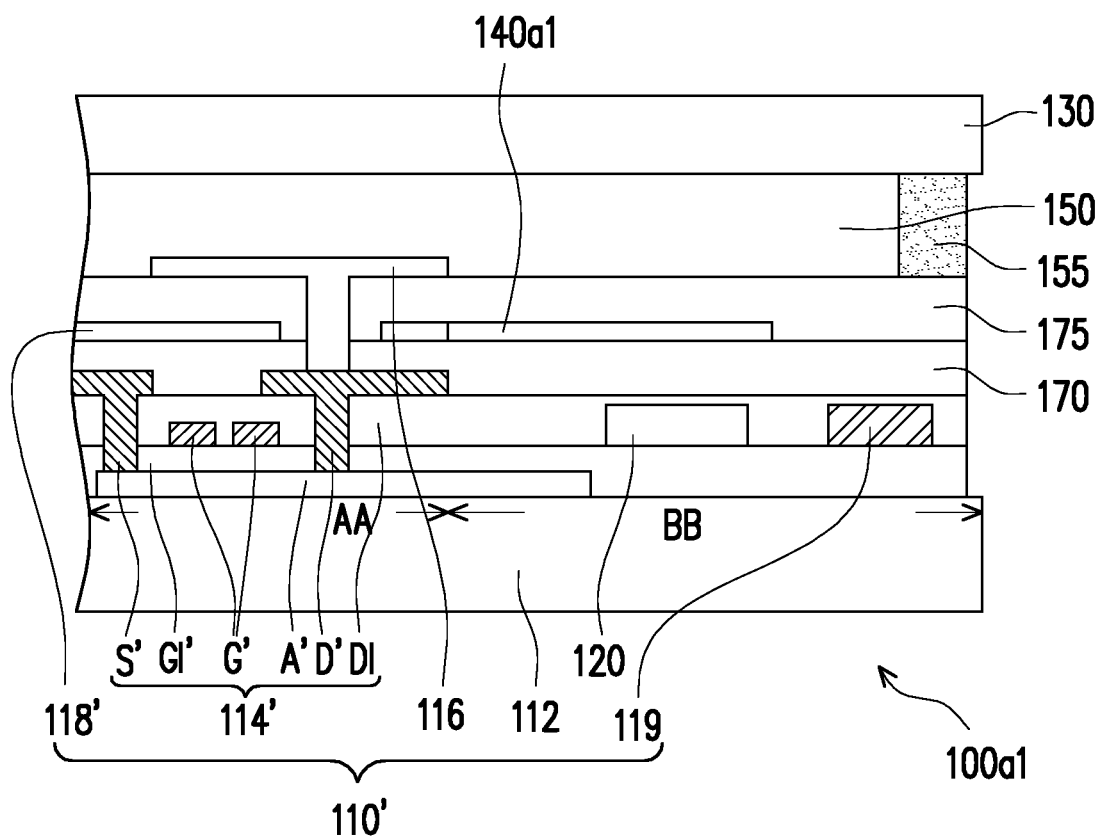
FIG. 1D illustrates a partial cross-sectional view of a touch device according to another embodiment of the disclosure.
Figure 1E:
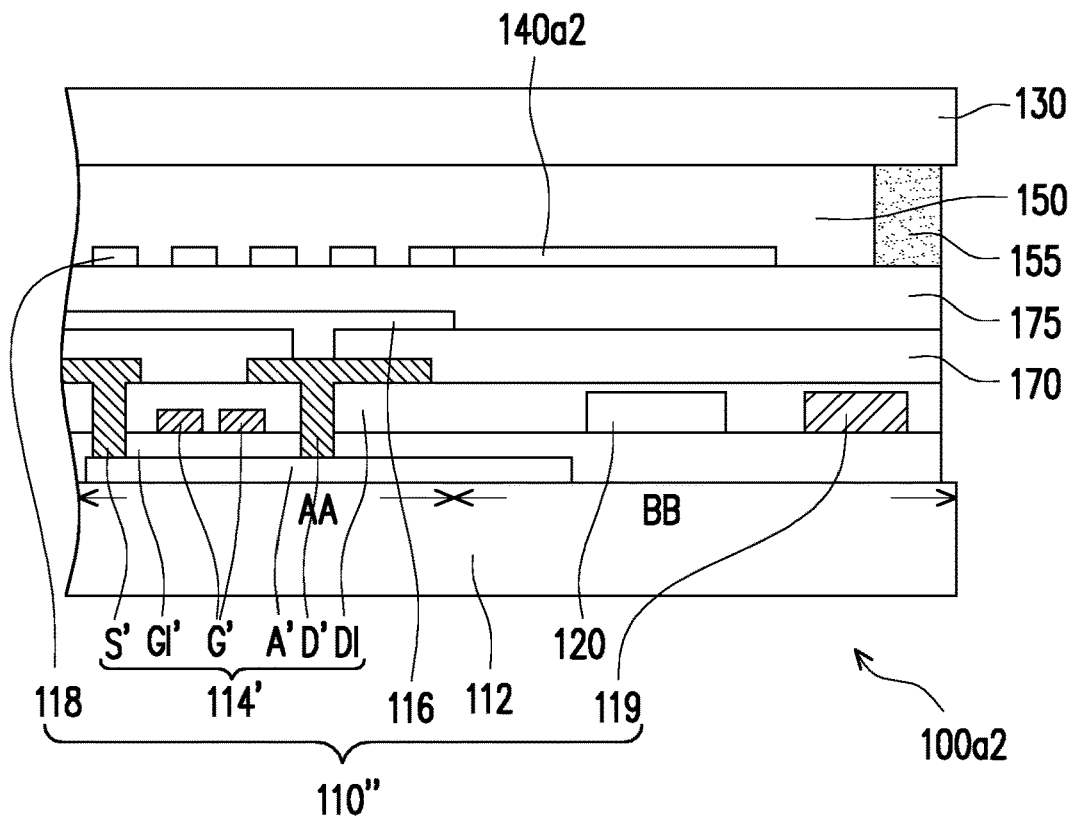
FIG. 1E illustrates a partial cross-sectional view of a touch device according to yet another embodiment of the disclosure.

It is worth mentioning that, the array substrate 110 is not limited only to be disposed as FIG. 1B, but may also be disposed as FIG. 1D and FIG. 1E. Specifically, referring to FIG. 1D and FIG. 1E, in a touch devices 100a1 (or 100a2), an active layer A' of an array substrate 110' (or 110") adopts Low Temperature Poly-silicon (LTPS). Therefore, active devices 114' are top-gate type. That is to say, the active layer A' is disposed on the base plate 112; a gate insulation layer GI' covers the active layer A'; a gate G' is disposed on the gate insulation layer GI'; an inner dielectric layer DI covers the gate insulation layer GI'; and a source S' and a drain D' are disposed on the inner dielectric layer DI and penetrate through the inner dielectric layer DI and the gate insulation layer GI' to be in contact with the active layer A'. Herein, the active device 114' is a structure of double-gate G'. However, in other embodiments, the active device 114' may also be a structure of single-gate G', which is not particularly limited herein.

Figure 1F:
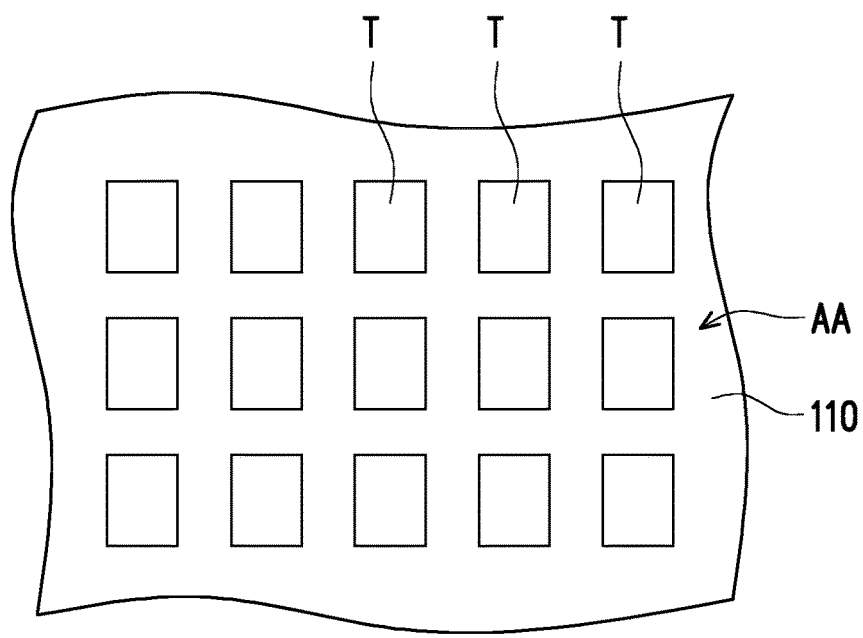
FIG. 1F illustrates a top view of the array substrate of FIG. 1A.

More specifically, the difference between FIG. 1D and FIG. 1E is that, a common electrode 118' in FIG. 1D is disposed between the pixel electrodes 116 and the base plate 112, a shielding pattern 140a1 is structurally and electrically connected to the common electrode 118', and the shielding pattern 140a1 belongs to the same layer as the common electrode 118' or include the same material as the common electrode 118'. In other words, the shielding pattern 140a1 and the common electrode 118' are the same layer. 'Belongs to the same layer' means the shielding pattern 140a1 could have the same material with the common electrode 118', or use the same manufacturing process with the common electrode 118', or use the same photo mask with the common electrode 118'. On the other hand, the common electrode 118 in FIG. 1E is disposed between the pixel electrodes 116 and the opposite substrate 130, a shielding pattern 140a2 is structurally and electrically connected to the common electrode 118, and the shielding pattern 140a2 belongs to the same layer as the common electrode 118 or include the same material as the common electrode 118'. In other words, the shielding pattern 140a2 and the common electrode 118' are the same layer. Further, referring to FIG. 1F, the touch device 100a of the present embodiment further includes a plurality of touch units T, wherein the touch units T are disposed in the display region AA of the array substrate 110. Herein, based on different sensing methods, the touch units T may be resistive touch units, capacitive touch units (including self-capacitive touch units or mutual-capacitive touch units), optical touch units, acoustic wave touch units or electromagnetic touch units. It should be noted that, the touch units T illustrated in FIG. 1F indicate locations of the touch sensing points rather than specific structures of the touch units T. For instance, the touch units T being the capacitive touch units may be composed of at least one touch driving unit in X direction and at least one touch sensing unit in Y direction (which are interchangeable), in another embodiment, a plurality of touch driving units in X direction and a plurality of touch sensing units in Y direction, wherein the touch driving units in X direction and the touch sensing units in Y direction may be disposed on the array substrate 110 and the opposite substrate 130 respectively, and ones of the touch driving units in X direction and the touch sensing units in Y direction belong to the same layer as the common electrode 118 or the pixel electrodes 116. In other words, ones of the touch driving units in X direction and the touch sensing units in Y direction and the common electrode 118 or the pixel electrodes 116 include the same material. Ones of the touch driving units in X direction and the touch sensing units in Y direction and the common electrode 118 or the pixel electrodes are the same layer. If the touch units T are the self-capacitance touch units, driving and sensing operations are performed simply by the common electrode 118, in other words, each of the common electrodes 118 could have both sensing and driving function. Because the touch units T of the present embodiment are the self-capacitance touch devices which directly use the common electrode 118 to perform the driving and sensing operations, in addition to steps in manufacturing process of the touch device 100a being reduced, an overall manufacturing costs and thickness of the touch device 100a may also be effectively reduced.

Particularly, referring back to FIG. 1B, the shielding pattern 140a of the present embodiment is, substantially, structurally and electrically connected to the common electrode 118. Accordingly, the shielding pattern 140a and the common electrode 118 belong to the same layer, such that the manufacturing costs may be effectively reduced since they use the same photo mask. In other words, the shielding pattern 140a and the common electrode 118 include the same material, such as a common electrode including, for example, an indium tin oxide (ITO), an indium zinc oxide (IZO), an Al doped ZnO (AZO), an Indium-Gallium-Zinc Oxide (IGZO), a Ga doped zinc oxide (GZO), a Zinc-Tin Oxide (ZTO), $In_2O_3$, ZnO or $SnO_2$, but the disclosure is not limited thereto. In addition, a normal projection of the shielding pattern 140a on the array substrate 110 completely covers a normal projection of the gate driving circuit 120 on the array substrate 110. In other words, the normal projection of the gate driving circuit 120 on the array substrate 110 is completely located within the normal projection of the shielding pattern 140a on the array substrate 110, and the first projection completely covers the second projection. Naturally, in other embodiments not illustrated, it is also possible that the normal projection of the shielding pattern 140a on the array substrate 110 partially overlaps with the normal projection of the gate driving circuit 120 on the array substrate 110, and partially doesn't overlap with the normal projection of the gate driving circuit 120 on the array substrate 110, and the disclosure is not limited thereto.

In addition, the opposite substrate 130 of the present embodiment is, substantially, a color filter substrate. As shown in FIG. 1A, a surface area of the opposite substrate 130 is, substantially, less than a surface area of the array substrate 110. Furthermore, the touch device 100a further includes a display medium 150, wherein the display medium 150 is disposed between the array substrate 110 and the opposite substrate 130. Herein, the display medium 150 is, for example, a liquid crystal layer, but the disclosure is not limited thereto, it could be micro-led or organic light emitting structure. In addition, the touch device 100a of the present embodiment further includes a sealant layer 155, which is disposed between the array substrate 110 and the opposite substrate 130, so as to at least seal the display medium 150 in between the array substrate 110 and the opposite substrate 130.

In the present embodiment, the shielding pattern 140a is disposed between the array substrate 110 and the opposite substrate 130, and the normal projection of the shielding pattern 140a on the array substrate 110 overlaps with the normal projection of the gate driving circuit 120 on the array substrate 110. Accordingly, as compared to the transparent conductive layer disposed on the outer surface of the color filter substrate in conventional art, the disposition of the shielding pattern 140a of the present embodiment not only improve the possibility of the touch function of the touch units T from being affected, but also protects the gate driving circuit 120 from damage caused by ESD. In addition, because the shielding pattern 140a and the common electrode 118 belong to the same layer in the present embodiment, usage amount the photo mask may be reduced to effectively reduce the manufacturing costs.

It is worth mentioning that, in another embodiment not shown in the figure, the shielding pattern 140a and the pixel electrodes 116 belong to the same layer, but the shielding pattern 140a and the pixel electrodes 116 are not structurally and electrically connected. The shielding pattern 140a and the pixel electrodes 116 include the same material. The shielding pattern 140a and the pixel electrodes 116 are the same layer. Such shielding pattern 140a is electrically connected to the common electrode 118 through holes of the insulation layer between the pixel electrodes 116 and the common electrode 118. In such embodiment, since the shielding pattern 140a and the pixel electrodes 116 belong to the same layer in the present embodiment, usage amount of the photo mask may also be reduced to effectively reduce the manufacturing costs.

It should be noted that the reference numerals and a part of the contents in the previous embodiment are used in the following embodiments, in which identical reference numerals indicate identical or similar components, and repeated description of the same technical contents is omitted. For a detailed description of the omitted parts, reference can be found in the previous embodiment, and no repeated description is contained in the following embodiments.

Figure 2:
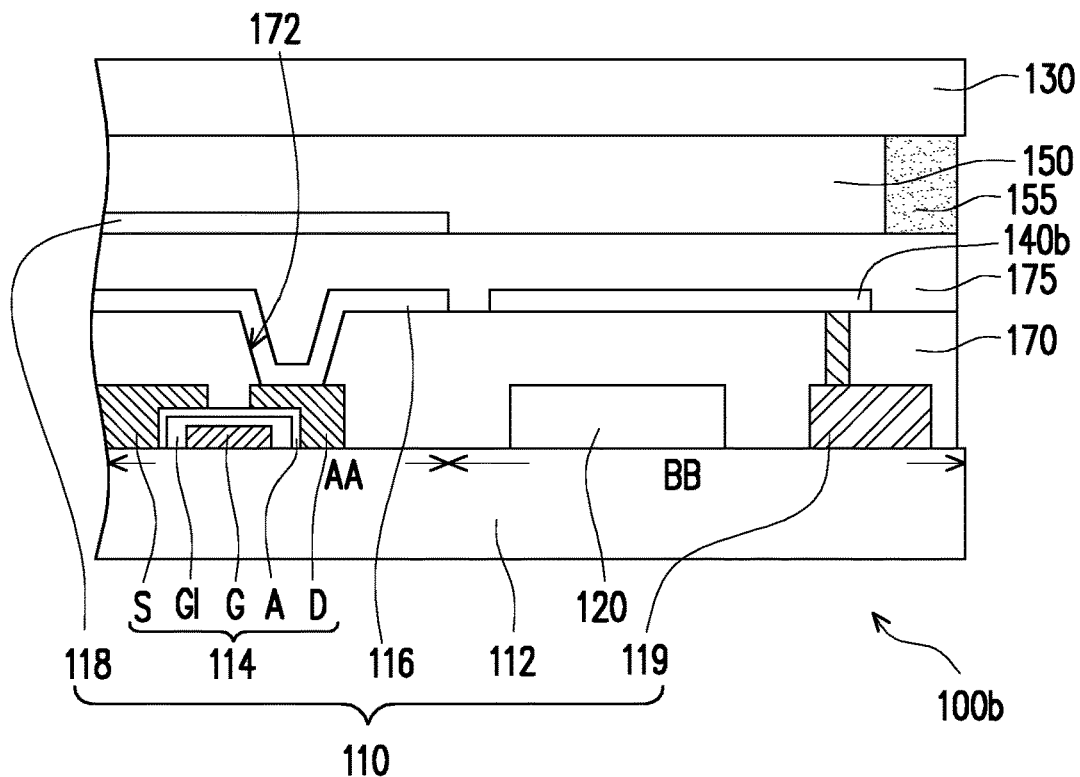
FIG. 2 illustrates a partial cross-sectional view of a touch device according to an embodiment of the disclosure.

FIG. 2 illustrates a partial cross-sectional view of a touch device according to an embodiment of the disclosure. Referring to FIG. 2, a touch device 100b of the present embodiment is similar to the touch device 100a of FIG. 1B, and the major difference between the two includes: a shielding pattern 140b of the present embodiment is electrically connected to the ground ring 119, and the shielding pattern 140b and the pixel electrodes 116 belong to the same layer. In other words, the shielding pattern 140b and the pixel electrodes 116 include the same material. The shielding pattern 140b and the pixel electrodes 116 are the same layer. In other embodiments, the shielding pattern 140b may also belong to the same layer as the common electrode 118, and the disclosure is not limited thereto. In other embodiments not illustrated, it is also possible that the pixel electrodes 116 are located above the common electrode 118. As shown in FIG. 2, although the shielding pattern 140b and the pixel electrodes 116 belong to the same layer, the shielding pattern 140b is not structurally and electrically connected to the pixel electrodes 116. In addition, a normal projection of the shielding pattern 140b on the array substrate 110, substantially, completely covers a normal projection of the gate driving circuit 120 on the array substrate 110. Naturally, in other embodiments not illustrated, it is also possible that the normal projection of the shielding pattern 140b on the array substrate 110 partially overlaps with the normal projection of the gate driving circuit 120 on the array substrate 110, and the disclosure is not limited thereto.

Figure 3:
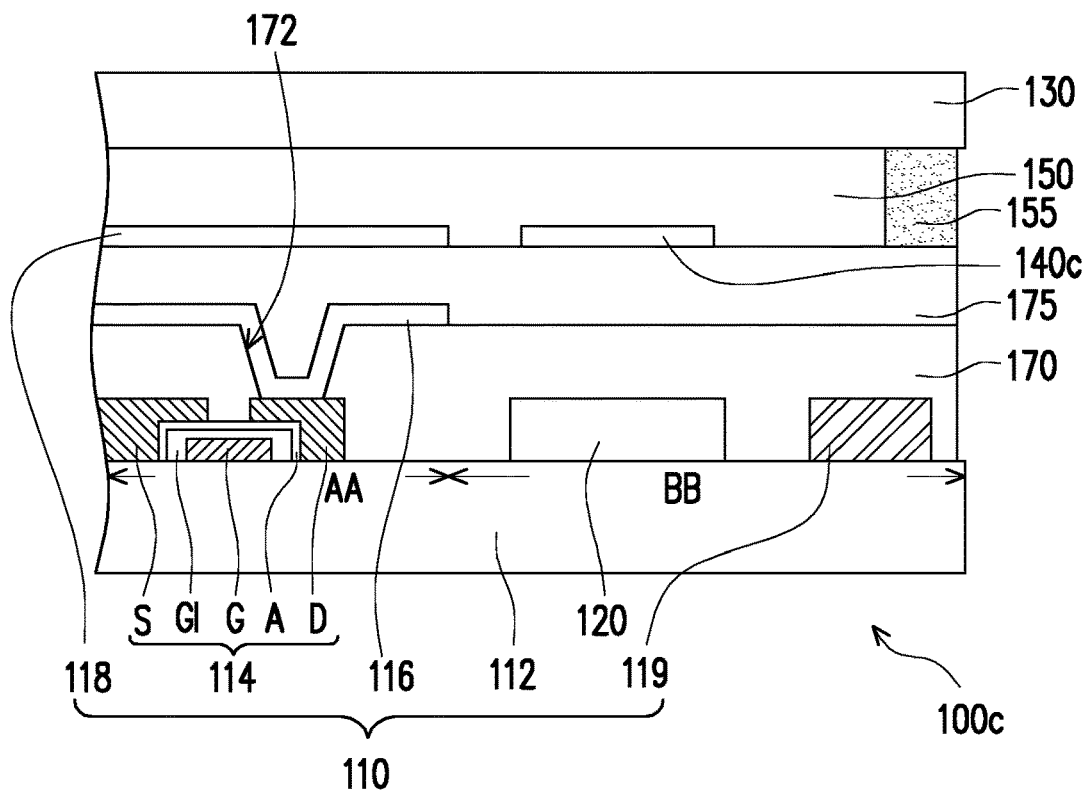
FIG. 3 illustrates a partial cross-sectional view of a touch device according to another embodiment of the disclosure.

FIG. 3 illustrates a partial cross-sectional view of a touch device according to another embodiment of the disclosure. Referring to FIG. 3, a touch device 100c of the present embodiment is similar to the touch device 100a of FIG. 1B, and the major difference between the two includes: a shielding pattern 140c of the present embodiment and the common electrode 118 belong to the same layer, and the shielding pattern 140c is electrically floating. The shielding pattern 140c and the common electrode 118 includes the same material. The shielding pattern 140c and the common electrode 118 are the same layer. In other words, the shielding pattern 140c of the present embodiment is not electrically connected to the common electrode 118, the pixel electrodes 116 or the ground ring 119. In other embodiments not illustrated, the shielding pattern 140c may also belong to the same layer as the pixel electrodes 116, and the disclosure is not limited thereto. In addition, a normal projection of the shielding pattern 140c on the array substrate 110, substantially, partially overlaps with the normal projection of the gate driving circuit 120 on the array substrate 110. Naturally, in other embodiments not illustrated, it is also possible that the normal projection of the shielding pattern 140c on the array substrate 110 completely covers the normal projection of the gate driving circuit 120 on the array substrate 110, and the disclosure is not limited thereto.

Figure 4:
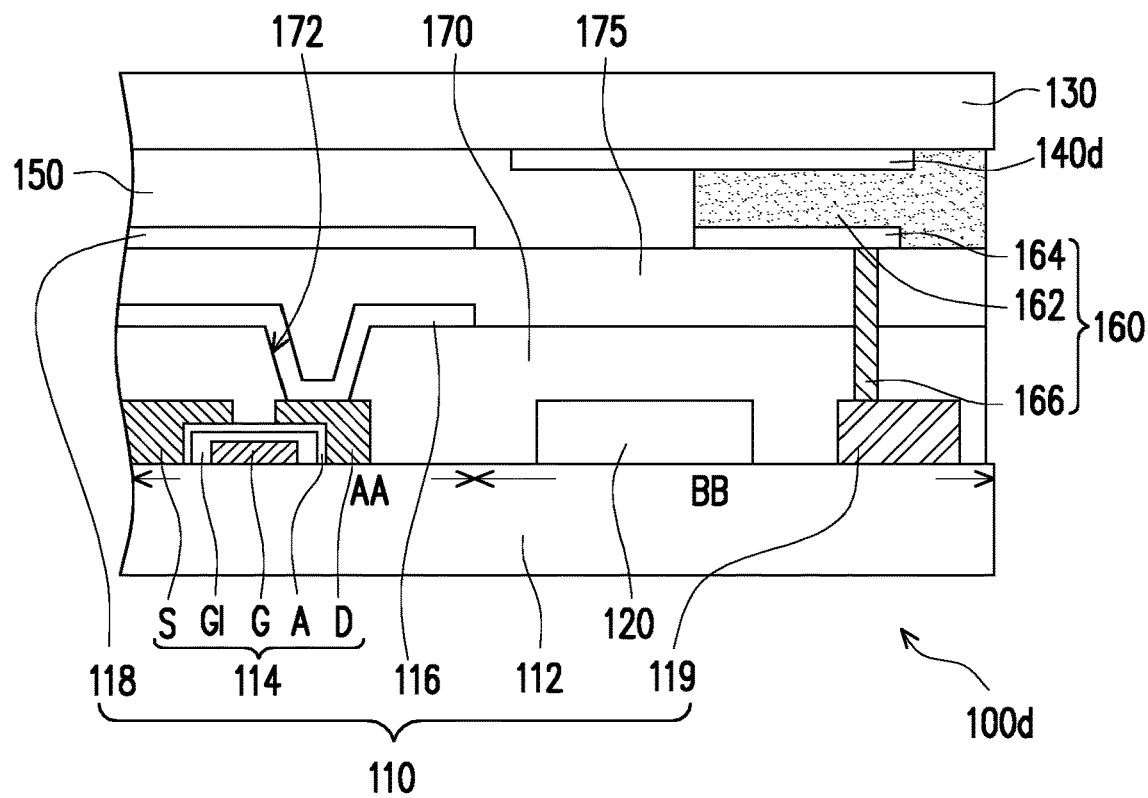
FIG. 4 illustrates a partial cross-sectional view of a touch device according to another embodiment of the disclosure.

FIG. 4 illustrates a partial cross-sectional view of a touch device according to another embodiment of the disclosure. Referring to FIG. 4, a touch device 100d of the present embodiment is similar to the touch device 100a of FIG. 1B, and the major difference between the two includes: a shielding pattern 140d of the present embodiment is disposed on the opposite substrate 130, and the shielding pattern 140d is electrically connected to the ground ring 119 through a conductive structure 160. Specifically, the conductive structure 160 includes a sealant layer 162 with electric conductivity, a conductive layer 164 and a conductive hole 166. The sealant layer 162 with electric conductivity is disposed between the shielding pattern 140d and the conductive layer 164, and the conductive hole 166 is disposed between the conductive layer 164 and the ground ring 119. The shielding pattern 140d sequentially passes through the sealant layer 162 with electric conductivity, the conductive layer 164 and the conductive hole 166 to be electrically connected to the ground ring 119. Herein, a material of the sealant layer 162 with electric conductivity is, for example, an adhesive material containing gold particles or other metal particles, and the conductive layer 164, for example, belongs to the same layer as the pixel electrodes 116 or the common electrode 118, but the disclosure is not limited to the above.

Figure 5:
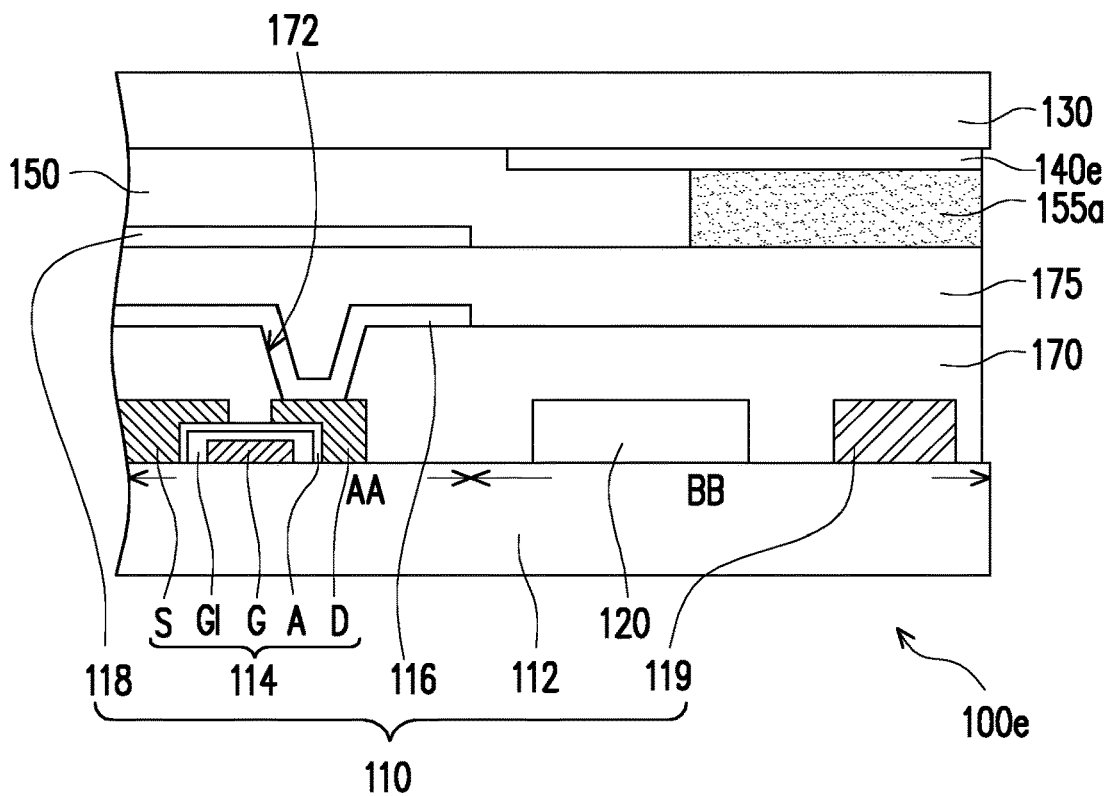
FIG. 5 illustrates a partial cross-sectional view of a touch device according to another embodiment of the disclosure.

FIG. 5 illustrates a partial cross-sectional view of a touch device according to another embodiment of the disclosure. Referring to FIG. 5, a touch device 100e of the present embodiment is similar to the touch device 100a of FIG. 1B, and the major difference between the two includes: a shielding pattern 140e of the present embodiment is disposed on the opposite substrate 130, and the shielding pattern 140e is electrically floating. In other words, the shielding pattern 140e of the present embodiment is not electrically connected to the common electrode 118, the pixel electrodes 116 or the ground ring 119. The shielding pattern 140e is completely in the peripheral region BB. Because a material of a sealant layer 155a is an insulating material, the shielding pattern 140e cannot be electrically connected to the elements on the array substrate 110 through the sealant layer 155a. Therefore, the shielding pattern 140e is in the state of electrically floating.

In summary, the touch device could be an in-cell touch device, and the touch device of the disclosure has the shielding pattern, wherein the shielding pattern is disposed between the array substrate and the opposite substrate, and the normal projection of the shielding pattern on the array substrate at least partially overlaps with the normal projection of the gate driving circuit on the array substrate. Accordingly, as compared to the transparent conductive layer disposed on the outer surface of the color filter substrate in conventional art, the disposition of the shielding pattern of the disclosure not only improve the possibility of the touch function of the touch units from being affected, but also protect the gate driving circuit from damage caused by ESD. Further, because the shielding pattern of the disclosure may also belong to the same layer as the pixel electrodes or the common electrode above the array substrate, usage amount of the photo mask may be reduced to effectively reduce the manufacturing costs. In addition, the shielding pattern of the disclosure may also be disposed on the opposite substrate, and it falls in the scope of the disclosure for which protection is sought as long as the shielding pattern is disposed between the array substrate and the opposite substrate, and the normal projection of the shielding pattern on the array substrate overlaps with the normal projection of the gate driving circuit on the array substrate. The shielding pattern disposed between the array substrate and the opposite substrate protects the shielding pattern and prevents the function of shielding the gate driving circuit from being affected by external scratches, so that a reliability of the device may be ensured.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents. In addition, the combination of various claims and embodiments are within the scope of the disclosure.

What is claimed is:

1. A touch device, comprising:
an array substrate, having a display region and a peripheral region, the peripheral region connecting to the display region;
at least one gate driving circuit, disposed on the array substrate and located in the peripheral region;
an opposite substrate, disposed opposite to the array substrate; and
a shielding pattern, disposed between the array substrate and the opposite substrate, wherein the shielding pattern projected on the array substrate is formed a first projection, the gate driving circuit projected on the array substrate is formed a second projection, the first projection at least partially overlaps with the second projection,
wherein the array substrate comprises:
a base plate;
a plurality of active devices, arranged in array on the base plate and disposed in the display region;
a plurality of pixel electrodes, disposed on the base plate and located in the display region, wherein the pixel electrodes are electrically connected to the active devices respectively;
a common electrode, disposed between the base plate and the pixel electrodes or between the opposite substrate and the pixel electrodes, the common electrode being located in the display region; and
a ground ring, disposed on the base plate and located in the peripheral region, wherein the at least one gate driving circuit is located between the ground ring and the display region,
wherein the shielding pattern is structurally and electrically connected to the common electrode, the shielding pattern and the common electrode or the pixel electrodes include the same material.

2. The touch device as recited in claim 1, wherein the shielding pattern and the common electrode or the pixel electrodes are the same layer.

3. The touch device as recited in claim 1, further comprising:
at least one touch driving unit and at least one touch sensing unit, one of the touch driving unit and the touch sensing unit being located on the opposite substrate, the other one of the touch driving unit and the touch sensing unit being located on the array substrate.

4. The touch device as recited in claim 1, wherein the touch device is a self-capacitance touch device.

5. The touch device as recited in claim 1, wherein the display medium is disposed between the array substrate and the opposite substrate.

6. The touch device as recited in claim 1, wherein the touch device is an in-cell touch device.

7. A touch device, comprising:
an array substrate, having a display region and a peripheral region, the peripheral region connecting to the display region;
at least one gate driving circuit, disposed on the array substrate and located in the peripheral region;
an opposite substrate, disposed opposite to the array substrate; and
a shielding pattern, disposed between the array substrate and the opposite substrate, wherein the shielding pattern projected on the array substrate is formed a first projection, the gate driving circuit projected on the array substrate is formed a second projection, the first projection at least partially overlaps with the second projection,
wherein the array substrate comprises:
a base plate;
a plurality of active devices, arranged in array on the base plate and disposed in the display region;
a plurality of pixel electrodes, disposed on the base plate and located in the display region, wherein the pixel electrodes are electrically connected to the active devices respectively;
a common electrode, disposed between the base plate and the pixel electrodes or between the opposite substrate and the pixel electrodes, the common electrode being located in the display region; and
a ground ring, disposed on the base plate and located in the peripheral region, wherein the at least one gate driving circuit is located between the ground ring and the display region,
wherein the shielding pattern is electrically floating, and the shielding pattern and the pixel electrodes or the common electrode includes the same material.

8. The touch device as recited in claim 7, wherein the shielding pattern and the common electrode or the pixel electrodes are the same layer.

9. The touch device as recited in claim 7, further comprising:
at least one touch driving unit and at least one touch sensing unit, one of the touch driving unit and the touch sensing unit being located on the opposite substrate, the other one of the touch driving unit and the touch sensing unit being located on the array substrate.

10. The touch device as recited in claim 7, wherein the touch device is a self-capacitance touch device.

11. The touch device as recited in claim 7, wherein the display medium is disposed between the array substrate and the opposite substrate.

12. The touch device as recited in claim 7, wherein the touch device is an in-cell touch device.

13. A touch device, comprising:
an array substrate, having a display region and a peripheral region, the peripheral region connecting to the display region;
at least one gate driving circuit, disposed on the array substrate and located in the peripheral region;
an opposite substrate, disposed opposite to the array substrate; and
a shielding pattern, disposed on the opposite substrate, wherein the shielding pattern projected on the array substrate is formed a first projection, the gate driving circuit projected on the array substrate is formed a second projection, the first projection at least partially overlaps with the second projection, wherein the array substrate comprises:
a base plate;
a plurality of active devices, arranged in array on the base plate and disposed in the display region;
a plurality of pixel electrodes, disposed on the base plate and located in the display region, wherein the pixel electrodes are electrically connected to the active devices respectively;
a common electrode, disposed between the base plate and the pixel electrodes or between the opposite substrate and the pixel electrodes, the common electrode being located in the display region; and
a ground ring, disposed on the base plate and located in the peripheral region, wherein the at least one gate driving circuit is located between the ground ring and the display region, wherein the shielding pattern is electrically connected to the ground ring through a conductive structure.

14. The touch device as recited in claim 13, wherein the shielding pattern is completely in the peripheral region.

15. A touch device, comprising:
an array substrate, having a display region and a peripheral region, the peripheral region connecting to the display region;
at least one gate driving circuit, disposed on the array substrate and located in the peripheral region;
an opposite substrate, disposed opposite to the array substrate; and
a shielding pattern, disposed on the opposite substrate, wherein the shielding pattern projected on the array substrate is formed a first projection, the gate driving circuit projected on the array substrate is formed a second projection, the first projection at least partially overlaps with the second projection,
wherein the array substrate comprises:
a base plate;
a plurality of active devices, arranged in array on the base plate and disposed in the display region;
a plurality of pixel electrodes, disposed on the base plate and located in the display region, wherein the pixel electrodes are electrically connected to the active devices respectively;
a common electrode, disposed between the base plate and the pixel electrodes or between the opposite substrate and the pixel electrodes, the common electrode being located in the display region; and
a ground ring, disposed on the base plate and located in the peripheral region, wherein the at least one gate driving circuit is located between the ground ring and the display region, wherein the shielding pattern is electrically floating.

16. The touch device as recited in claim 13, further comprising:
at least one touch driving unit and at least one touch sensing unit, one of the touch driving unit and the touch sensing unit being located on the opposite substrate, the other one of the touch driving unit and the touch sensing unit being located on the array substrate.

17. The touch device as recited in claim 13, wherein the touch device is a self-capacitance touch device.

18. The touch device as recited in claim 13, wherein the display medium is disposed between the array substrate and the opposite substrate.

19. The touch device as recited in claim 13, wherein the touch device is an in-cell touch device.

* * * * *